(12) United States Patent
Imai et al.

(10) Patent No.: US 7,157,853 B2
(45) Date of Patent: Jan. 2, 2007

(54) PLANAR LIGHT EMITTING DIODE WITH SHIELDING AND BACK LIGHT UNIT

(75) Inventors: Sadato Imai, Yamanashi (JP); Koichi Fukasawa, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 217 days.

(21) Appl. No.: 10/673,516

(22) Filed: Sep. 30, 2003

(65) Prior Publication Data

US 2004/0061440 A1  Apr. 1, 2004

(30) Foreign Application Priority Data

Sep. 30, 2002  (JP) .......................... P2002-287428

(51) Int. Cl.
 *H01J 1/62*  (2006.01)
 *F21V 7/04*  (2006.01)
(52) U.S. Cl. .................. 313/512; 362/612; 362/613
(58) Field of Classification Search ............. 313/512; 362/327, 555, 267, 311, 800, 612, 610, 618, 362/631, 628, 249, 252, 611, 613
See application file for complete search history.

(56) References Cited

U.S. PATENT DOCUMENTS 3,694,902 A * 10/1972 Apgar et al. .................. 438/26
4,143,394 A * 3/1979 Schoberl ....................... 257/98
5,803,573 A   9/1998 Osawa et al.
6,392,342 B1 * 5/2002 Parikka ....................... 313/512
6,677,707 B1 * 1/2004 Dietiker ...................... 313/498

FOREIGN PATENT DOCUMENTS

KR   1997-75994   12/1997

* cited by examiner

Primary Examiner—Joseph Williams
Assistant Examiner—Bumsuk Won
(74) Attorney, Agent, or Firm—Browdy and Neimark, PLLC

(57) ABSTRACT

A light emitting diode including an element substrate, a light emitting element mounted on said element substrate, a sealing body which transmits and emits light from the light emitting element and which seals the light emitting element, and a light shielding member to form light emitting parts for directing light from the sealing body in two dimensional directions which are formed from a combination of two axes of three dimensional axes X, Y and Z, has the light shielding member configured to cause one portion of the light emitting parts to emit light and the other of the light emitting parts to shield light.

6 Claims, 8 Drawing Sheets

PLANAR LIGHT EMITTING DIODE WITH SHIELDING AND BACK LIGHT UNIT

BACKGROUND OF THE INVENTION

1. Field of the Invention

The present invention relates to a light emitting diode capable of directing light emitted therefrom in a predetermined direction, more specifically, to a light emitting diode suitable for use in a back light source for illuminating a liquid crystal displaying panel or the like and a back light unit provided with the light emitting diode.

2. Description of the Prior Art

Conventionally, this kind of light emitting diode includes an element substrate provided with electrodes and wiring patterns, a light emitting element mounted on the element substrate and a sealing body made of a transparent resin material for sealing the light emitting element. The sealing body includes one or more light emitting surfaces having various shapes to emit light from the light emitting element to the outside of the sealing body.

FIG. 7 shows a typical example of a conventional light emitting diode 1 which is composed of a light emitting element 3 mounted on an element substrate 2 and a transparent square sealing body 4 for sealing the light emitting element 3. The element substrate 2 is fixed on a circuit substrate 6.

In order to emit light from the light emitting element 3 through one surface of the sealing body 4, for example, a front light emitting part 4a to the outside of the sealing body 4, both side surfaces 4b and 4c and upper and lower surfaces 4d and 4e of the sealing body 4, except for the front light emitting part 4a are covered by means of light shielding members 5.

The light emitting diode has a side light emitting type in which the front light emitting part 4a has a surface generally perpendicular to a surface 6a of the circuit substrate 6, and light emitted from the front light emitting part 4a is directed in a direction parallel with the surface 6a of the circuit substrate 6, as shown by the arrow in FIG. 7.

FIG. 8 shows an example of a conventional back light unit 11 which is provided with the aforementioned light emitting diode 1. The back light unit 11 is composed of an optical wave-guide 12 mounted on the surface 6a of the circuit substrate 6 and a light source for illuminating the optical wave-guide 12, for example, the light emitting diode 1 of the above type.

One side surface of the optical wave-guide 12 is formed with a light receiving surface 13 and for example, two light emitting diodes 1 are disposed on the surface 6a of the circuit substrate 6 in such a manner that the front light emitting part 4a of each of these light emitting diodes is faced with the light receiving surface 13 of the optical wave-guide 12.

In the back light unit 11, the light emitted from the front light emitting part 4a of the light emitting diode 1 is entered into the light receiving surface 13 to illuminate the optical wave-guide 12.

In this case, it is possible to cause light of a high brightness to enter from the front light emitting part 4a of the light emitting diode 1 into the light receiving surface 13 of the optical wave-guide 12, because the light receiving surface 13 of the optical wave-guide 12 is disposed to face the front light emitting 4a of the light emitting diode 1 and the both side surfaces 4b and 4c and upper and lower surfaces 4d and 4e of the sealing body 4 are coated with the light shielding members 5.

In the conventional light emitting diode 1, because the both side surfaces 4b and 4c and upper and bottom surfaces 4d and 4e of the sealing body 4 except for the front light emitting part 4a are coated with the light shielding members 5, the brightness of light emitted from the front light emitting part 4a can be increased, but, the directivity of light, in other words, a region of scattering the light becomes narrow. Therefore, if the optical wave-guide 12 having a relatively large plane size is illuminated, a plurality of light emitting diodes must be disposed along the light receiving surface 13 of the optical wave-guide 12, as shown in FIG. 8.

However, even though the plurality of light emitting diodes 1 are disposed, because of a narrow scattering region of light from the front light emitting part 4a, there is a problem that regions A (shaded areas in FIG. 8) which are not illuminated by lights are generated between the adjacent light emitting diodes 1 and 1, and at the opposite sides of the optical wave-guide 12, as shown in FIG. 8.

Consequently, the light emitting diodes 1 must be disposed with a narrow space in order to illuminate uniformly the light receiving surface 13 of the optical wave-guide 12. As a result, there is a problem that the number of the light emitting diode 1 becomes large and considerable time and labor are required for an attachment of the light emitting diode 1 and therefore a cost for manufacturing the back light unit 11 becomes high.

If a large number of light emitting diodes 1 are provided, there is a limitation to a space in which the light emitting diodes 1 are disposed, eventually, it is difficult to illuminate uniformly the optical wave-guide 12.

SUMMARY OF THE INVENTION

The present invention is made in view of the aforementioned problems of the prior art and it is a first object of the present invention to provide a light emitting diode capable of having a directivity of light emitted therefrom into a two dimensional space.

It is a second object of the present invention to provide a back light unit which can be illuminated uniformly with a high brightness.

To achieve the aforementioned first object, the light emitting diode according to the present invention comprises an element substrate, a light emitting element mounted on the element substrate, a translucent sealing body for sealing the light emitting element and for emitting light from the light emitting element, and a light shielding means to be formed on the sealing body light emitting planes for directing light from the light emitting part in two dimensional directions formed from a combination of either two axes of three dimensional axes X, Y and Z.

According to this invention, it is possible to illuminate uniformly and effectively a plane space of a wide region by giving a directivity of light in two dimensional spaces formed from a combination of either two axes of three dimensional axes X, Y and Z in which lights are spread, about the light emitting element. Therefore, it is possible to obtain a light emitting diode suitable to a light source for illuminating a thin plate-shaped optical wave-guide.

In one embodiment, the light shielding means comprises light shielding members for selectively shielding one portion of the light emitting parts formed on the sealing body, and the sealing body has light emitting parts arranged on three dimensional axes X, Y and Z which are perpendicular with respect to each other, if the light emitting part positioned on either one of the three dimensional axes X, Y and Z is a front light emitting part, the light shielding members shield top and bottom light emitting parts except for the front light emitting part and side light emitting parts on opposite and adjacent sides of the front light emitting part.

To achieve the aforementioned second object, there is provided a back light unit.

The back light unit comprises an element substrate, a light emitting element mounted on the element substrate, a sealing body which has a light emitting part for emitting light from the light emitting element sealed by the sealing body, an optical wave-guide having a light receiving surface for receiving light emitted from the light emitting part of the sealing body, and a light shielding means for directing the light from the light emitting part of the sealing body toward the light receiving surface of the optical wave-guide.

According to this invention, it is possible to enter uniformly the light from the sealing body to the light receiving surface of the thin plate-shaped optical wave-guide in a spread state and to guide within the optical wave-guide. As a result, it is possible to obtain a back light unit without a light emitting unevenness.

Concretely, if the light emitting part positioned on the X axis is a front light emitting part, the light emitting parts positioned on the Y axis are side light emitting parts and light emitting parts positioned on the Z axis are top and bottom light emitting parts, the front light emitting part is disposed to face to the light receiving surface of the optical wave-guide, and the light shielding means shields the top and bottom light emitting parts except for the front and side light emitting parts.

In the other embodiment of the present invention, the front light emitting part is formed from a surface generally parallel with the light receiving surface of the optical wave-guide and the side light emitting parts are formed into surfaces inclined to the light receiving surface.

In the further other embodiment of the present invention, the front light emitting part is formed into a semi-circular surface facing the light receiving surface of the optical wave-guide.

BREIF DESCRIPTION OF THE DRAWINGS

DETAILED DESCRIPTION OF THE PREFERRED EMBODIMENTS

Some embodiments of the present invention will be explained with reference to the accompanying drawings below.

Figure 1:
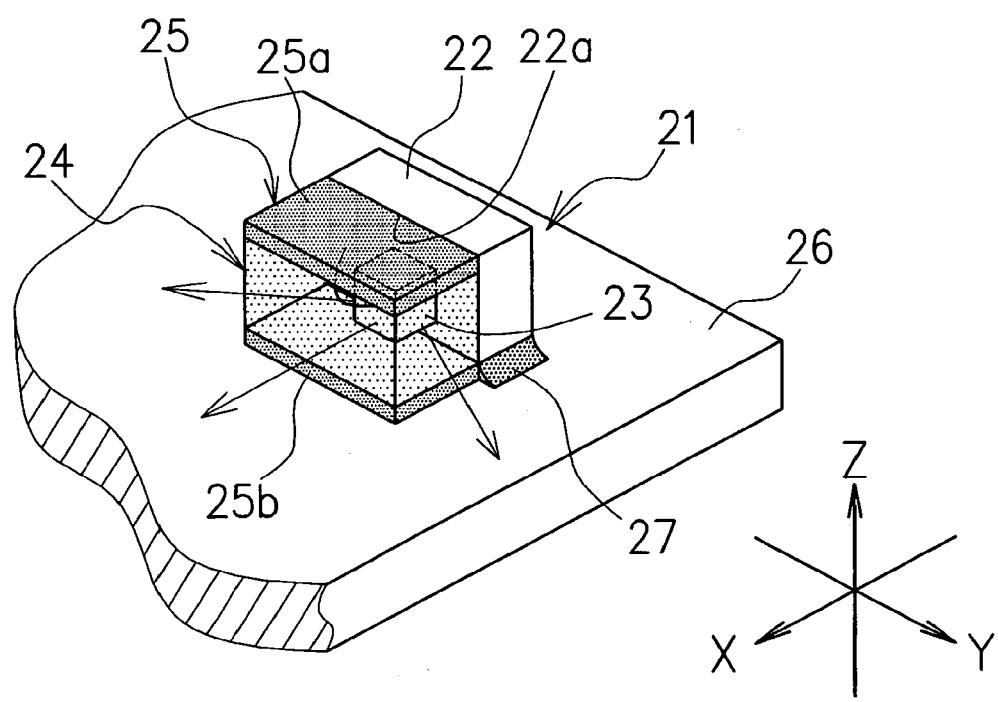
FIG. 1 is a perspective view showing one embodiment of a light emitting diode according to the present invention.
Figure 2:
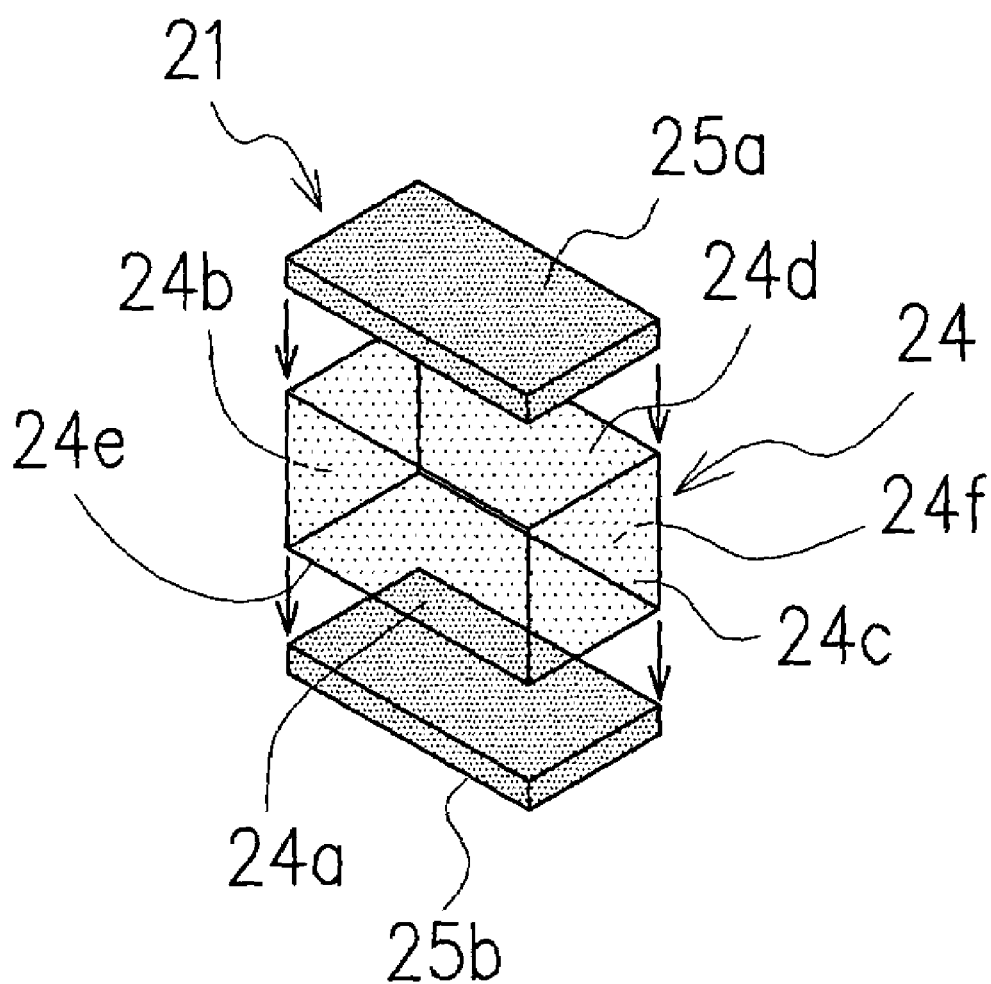
FIG. 2 is an exploded perspective view of one portion of the light emitting diode shown in FIG. 1.

Referring to FIGS. 1 and 2, a first embodiment of a light emitting diode 21 according to the present invention is shown. The light emitting diode 21 comprises an element substrate 22, a light emitting element 23 mounted on the element substrate 22 and a sealing body 24 for sealing the light emitting element 23. The element substrate 22 is fixed on a circuit substrate 26 by means of, for example, any adhesive 27.

The element substrate 22 is formed from a rectangular three dimensional member made of, for example, a glass epoxy or BT resin (Bismaleimide Triazine Resin) in the embodiment.

The element substrate 22 is provided with circuit patterns, electrodes (not shown) and so on for electrically conducting the element substrate 22 and light emitting element 23 and mounting the element substrate 22 on the circuit substrate 26 in order to apply the current to the light emitting element 23.

The light emitting element 23 is fixed on one surface of the element substrate 22, for example, a side surface 22a by means of a suitable means. The light emitting element 23 is composed of a silicon chip which has a generally square micro three dimensional shape and which includes a pair of element electrodes having anode and cathode electrodes. The light emitting element 23 is fixed at its bottom surface to the element substrate 22 by means of an insulating adhesive and element electrodes of the light emitting element are connected through bonding wires (not shown) with the electrodes on the element substrate 22.

The sealing body 24 is attached to the element substrate 22 so as to seal the light emitting element 23. The sealing body 24 is formed into a generally square three dimensional shape made of a resin of epoxy system having transparence or translucency of generally milky white color.

The sealing body 24 has one or more light emitting parts for emitting out light from the light emitting element 23.

More specifically, if three dimensional axes X, Y and Z are represented as shown in FIG. 1 in the embodiment, the sealing body 24 has a front light emitting part 24a which is lied in a plane formed on the Y axis and which is lied in front of a front surface of the light emitting element, a pair of side light emitting parts 24b and 24c which are lied in a plane on the X axis and which are lied on both sides of the front light emitting part, and a pair of top and bottom light emitting parts 24d and 24e which are lied in a plane on the Z axis and which are lied upward and downward of the front light emitting part 24a (see FIG. 2).

In addition, a light emitting surface 24f of the sealing body 24 contacting with the element substrate 22 is formed into a reflected plane for reflecting the light from the light emitting element 23 toward the front, side and top and bottom light emitting parts 24a, 24b and 24c and 24d and 24e, as shown in FIG. 2.

With the above structure, the light emitted from the light emitting element 23 is emitted in the three dimensional directions, in a direction of the Y axis from the front light emitting part 24a, in directions of the X axis from the side light emitting parts 24b and 24c, and in directions of the Z axis from the top and bottom light emitting parts 24d and 24e, respectively.

In this case, a brightness of the light from the front light emitting part 24a is higher slightly than that of the side and top and bottom light emitting parts 24b, 24c, 24d, and 24e, and the brightness of the light from each of the side light emitting parts 24b and 24c is similar substantially as that of the top and bottom light emitting parts 24d and 24e.

It should be noted in the present invention that there is provided, on the sealing body 24, a light shielding means 25 for directing the light emitted from each of the front, side and top and bottom light emitting parts 24a to 24e in the sealing body 24 to determine optionally an emitted direction and an emitted region of the light.

The light shielding means 25 has a function of one portion-light emitting and one potion-light shielding in which one or more of the plurality of light emitting parts of the sealing body 24, namely, front, side and top and bottom light emitting parts 24a, 24b, 24c, 24d and 24e are formed as light emitting parts and the others are light shielded, in the embodiment.

Of course, if the sealing body 24 has only one light emitting part, the light shielding means 25 shields one portion of this light emitting part.

In the embodiment as shown in FIGS. 1 and 2, the light shielding means 25 forms, for example, the front and side light emitting parts 24a, 24b and 24c as light emitting parts, and shields the top and bottom light emitting parts 24d and 24e to form the light emitting parts in the two dimensional directions of the X and Y axes.

Concretely, the light shielding means 25 comprises light shielding members 25a and 25b for shielding light from the top and bottom light emitting parts 24d and 24e.

The light shielding members 25a and 25b are composed of plate-shaped light shielding members attached to the top and bottom light emitting parts 24d and 24e. The light shielding members 25a and 25b may be made of a non-translucent epoxy resin.

In addition, by working surfaces of the light shielding members 25a and 25b which contact with the top and bottom light emitting parts 24d and 24e, into mirror-like surfaces or by mounting members having a high reflectance on the contacted surfaces, it is possible to enhance an effect of reflection of the light within the sealing body 24 and a brightness of the light emitted from the front and side light emitting parts 24a, 24b and 24c.

In the other example, the light shielding members 25a and 25b may be formed from a layer of painting for light shielding painted on the top and bottom light emitting parts 24d and 24e.

In the further other example, the light shielding members 25a and 25b may be formed from any shielding plates mounted on the top and bottom light emitting parts 24d and 24e detachably.

In the other example of the light shielding members, it is possible to form either one or more of the front, side, top and bottom light emitting parts 24a to 24e into light emitting parts and to shield the others, or to form a portion of each of the front, side, top and bottom light emitting parts 24a to 24e into a light emitting part and to form a portion of each the other light emitting parts into a light shielding part, according to an intended use.

As described above, it is possible to set the emission of the light from the sealing body 24 by the aforementioned light shielding means 25 to have a spread in a horizontal direction. In this way, setting the emission of the light in a particular direction is, eventually, able to set optionally a strength of light in the horizontal direction or a magnitude of brightness of the light.

Figure 3:
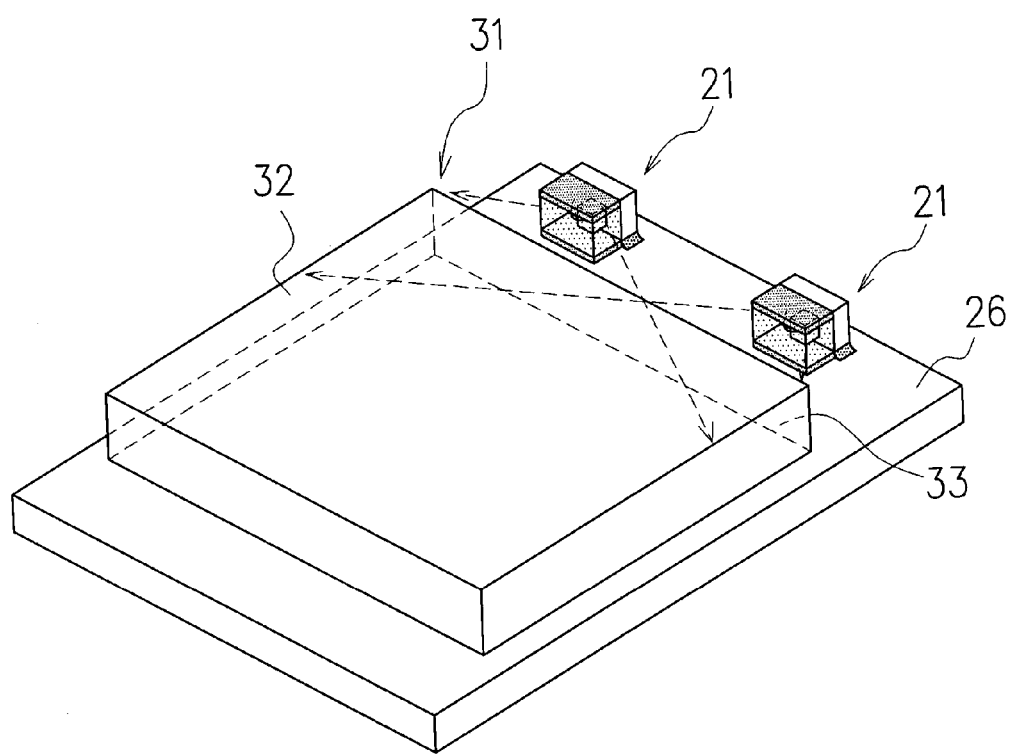
FIG. 3 is a perspective view showing a back light unit in which the light emitting diode as shown in FIG. 1 is used.
Figure 4:
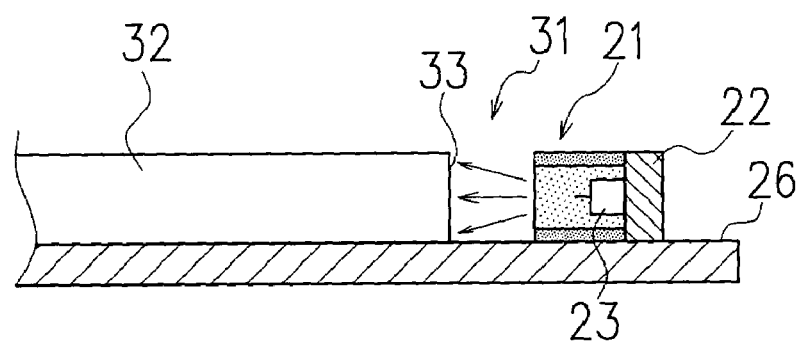
FIG. 4 is a side view with partially sectioned of the back light unit as shown in FIG. 3.

FIGS. 3 and 4 show a structure of a back light unit 31 in which two light emitting diodes 21 and 21, each being structured as described above, are arranged to face a light receiving surface 33 formed on a side surface of an optical wave-guide 32. The optical wave-guide 32 is fixed on the circuit substrate 26.

The back light unit 31 is mainly used as a back light of a liquid displaying panel (not shown) and has a structure that light emitted from the two light emitting diodes 21 enters into the light receiving surface 33 of the optical wave-guide 32 and illuminates from below the liquid displaying panel disposed upwardly of the optical wave-guide 32.

The optical wave-guide 32 is composed of a transparent acrylic plate in which has the generally same area as the liquid displaying panel and a thickness of a region of 0.5 mm to 1.0 mm.

Each of the light emitting diodes 21 and 21 is arranged in such a manner that a thickness of the sealing body 24 is set to become substantially the same as that of the optical wave-guide 32, the front light emitting part 24a as described above is disposed in the vicinity of the light receiving surface 33 to face parallely with it, as shown in FIG. 4.

In addition, the number of the light emitting diode 21 depends on a size of a plane of the optical wave-guide 32 or the light emitting parts of the light emitting diode 21, while it is preferable that the two light emitting diodes 21 and 21 are arranged with a space that the lights emitted from the side light emitting parts 24a and 24a which face mutually, in the adjacent light emitting diodes are overlapped slightly at the light receiving surface 33, as shown in FIG. 3.

Subsequently, an operation of light emitting the back light unit 31 will be explained with reference to FIGS. 3 and 4.

First, the light emitting element 23 of each of the light emitting diodes 21 is light-emitted with a predetermined luminescence by supplying a power to the element substrate 22. The light-emitted light is emitted from the front light emitting part 24a passing through the sealing body 24 of each light emitting diode 21. The emitted light extends substantially straightly and illuminates the light receiving surface 33. The lights emitted from the side light emitting parts 24b and 24c extend outwardly and obliquely at both sides of the light emitted from the front light emitting part 24a and illuminate the light receiving surface 33.

Consequently, the light receiving surface 33 of the optical wave-guide 32 receives light for spreading in a region of 180 degrees from the front and side light emitting parts 24a, 24b and 24c of each light emitting diode. Because the lights emitted from the opposite side light emitting parts of the light emitting diodes are also overlapped with respect to each other, a portion of the light receiving surface 33 that is not illuminated by the light is not generated.

On the other hand, because the top and bottom light emitting parts 24d and 24e of each light emitting diode 21 are shielded by the light shielding members 25a and 25b, while the light emitted from the light emitting element 23 is reflected on the top and bottom light emitting parts or refracted within the sealing body, and directed to the front and side light emitting parts 24a, 24b and 24c and then is emitted therefrom.

Accordingly, a light having a high brightness is emitted from the front and side light emitting parts and then is entered into the light emitting surface 33 of the optical wave-guide 32 to cause the entire optical wave-guide 32 to light-emit, more brightly.

In this way, because a direction or region of emission of the light emitted from the light emitting diode 21 can be set optionally by the light shielding means in accordance with an intended use or usage even though the intended use is an optical wave-guide having a wide plane area, it is possible to eliminate the number of the light emitting diode, thereby eliminating a consumed power of the light emitting diode.

In addition, in the back light unit 31 as described above, although the side light emitting parts 24b and 24c of each of the light emitting diodes 21 and 21 are all light emitting parts, it is possible to adjust a direction of spreading light emitted from the sealing body by shielding one portion of the side light emitting parts. For example, if one portion of the side light emitting parts near the element substrate 22 is shielded by the similar member to the light shielding members 25a and 25b, it is possible to increase the brightness of the light emitted from surfaces of the side light emitting parts which are not shielded and therefore the light of the high brightness can be directed to the light receiving surface of the optical wave-guide.

In the embodiment in the light emitting diode 21 as described above, although the sealing body 24 has been formed generally into the three dimensional shape or rectangular solid having front, side and top and bottom light emitting parts 24a, 24b, 24c, 24d and 24e, the sealing body may be formed into various shapes without being limited to the aforementioned shape.

Figure 5:
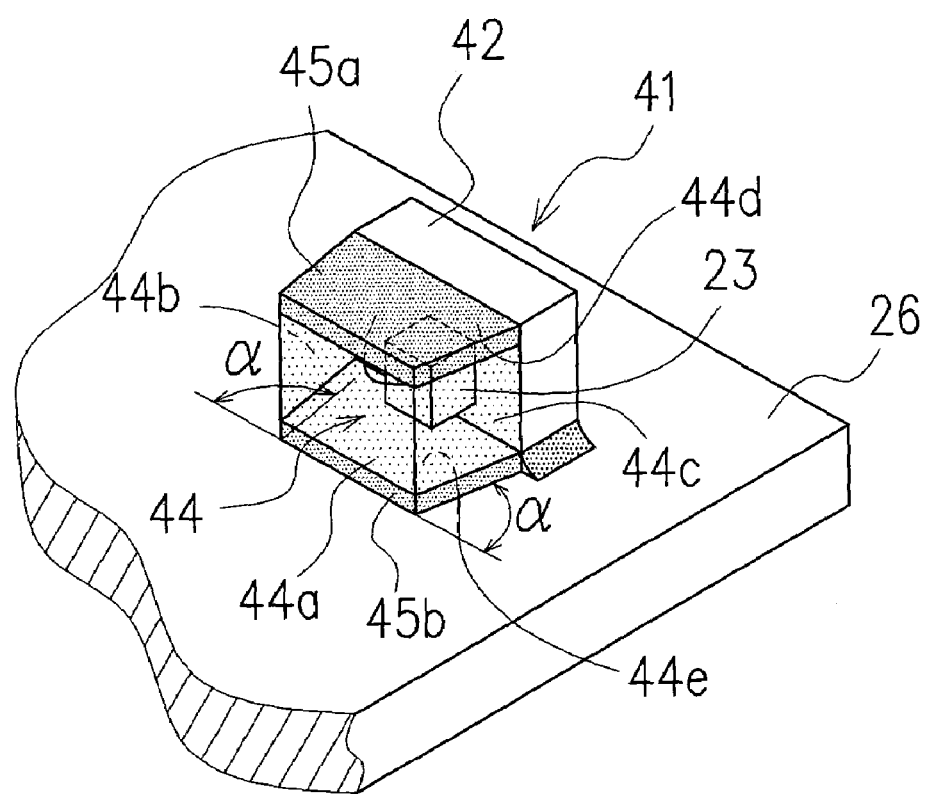
FIG. 5 is a perspective view showing another embodiment of the light emitting diode according to the present invention.

FIG. 5 illustrates a second embodiment of the light emitting diode. In the second embodiment, the same numerals are annexed to the same parts as that in the above first embodiment. A light emitting diode 41 shown in this embodiment includes a sealing body 44 having a generally corpus trapezoideum.

More specifically, the light emitting diode 41 comprises an element substrate 42 mounted on the circuit substrate 26, the light emitting element 23 attached to a side surface of the element substrate 42 and a sealing body 44 for sealing the light emitting element 23. The sealing body 44 has a trapezoidal shape of a front light emitting part 44a, side light emitting parts 44b and 44c, and top and bottom light emitting parts 44d and 44e. The side light emitting parts 44b and 44c are inclined to widen outwardly at an angle α as going from the front light emitting part 44a to the element substrate 42.

In this way, it is possible to narrow and widen the directivity of light to the light receiving surface 33 of the optical wave-guide 32 in a certain region by inclining the side light emitting parts 44b and 44c.

In addition, it is possible to enhance the brightness of light from the front and side light emitting parts 44a, 44b and 44c by shielding the top and bottom light emitting parts 44d and 44e by means of the light shielding members 45a and 45b, as shown in FIG. 5.

Figure 6:
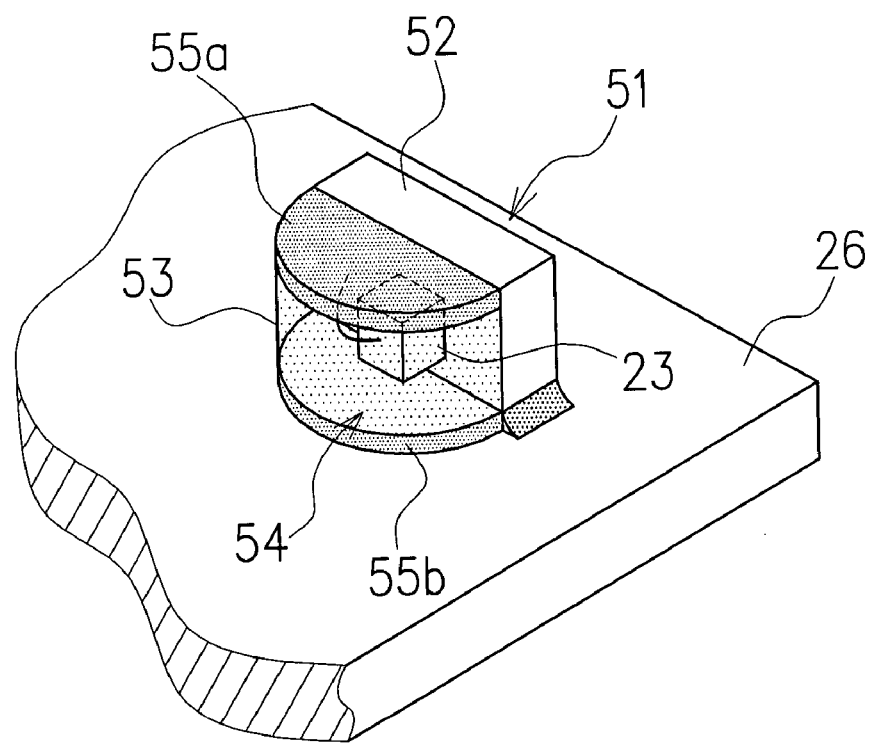
FIG. 6 is a perspective view showing still another embodiment of the light emitting diode according to the present invention.
Figure 7:
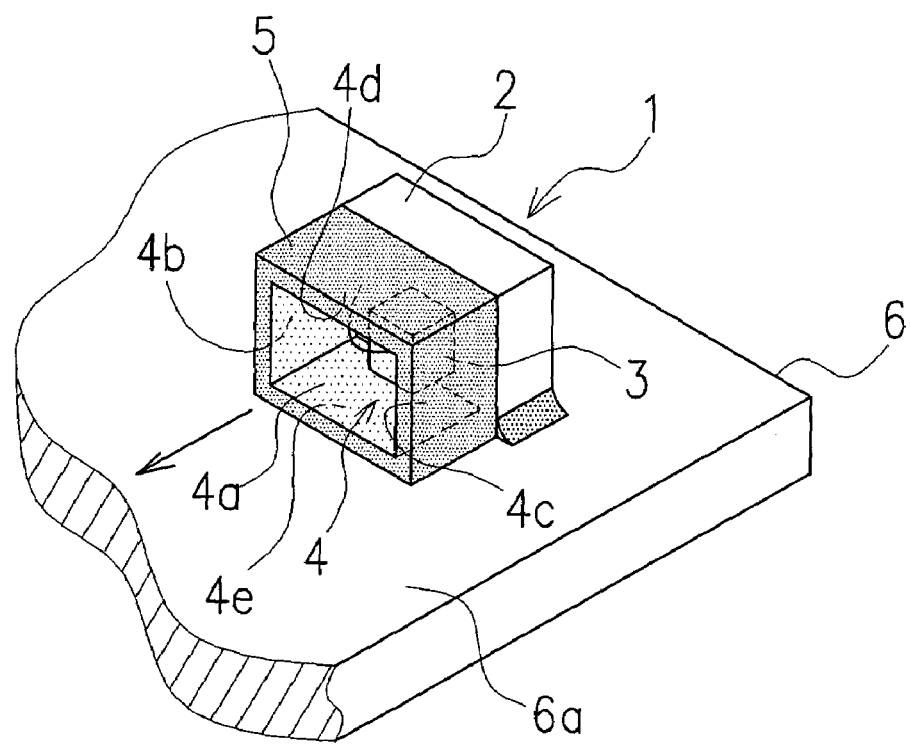
FIG. 7 is a perspective view showing a conventional light emitting diode of a side light emitting type.
Figure 8:
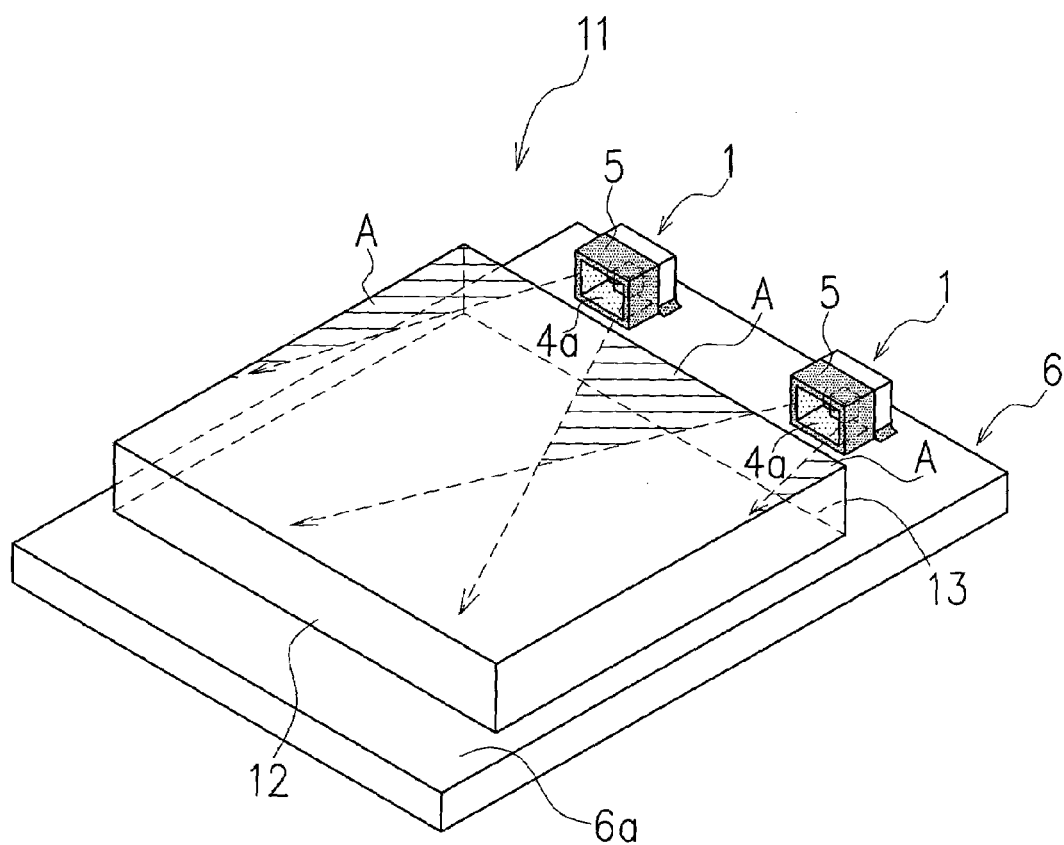
FIG. 8 is a perspective view showing a structure of a back light unit in which the conventional light emitting diode is provided.

FIG. 6 illustrates a third embodiment of the light emitting diode. In the third embodiment, the same numerals are annexed to the same parts as that in the above first embodiment. In a light emitting diode 51 shown in the third embodiment, the light emitting element 23 is fixed to an element substrate 52 and a sealing body 54 for sealing the light emitting element 23 includes a generally semi-circular light emitting part 53 in which the front and side light emitting parts are combined by a continuous curve. In this way, if the semi-circular light emitting part 53 is formed, it is possible to obtain the directivity of light which widens uniformly throughout generally 180 degrees about the light emitting element 23.

It is, further, possible to limit only the emitted light from curved light emitting part 53 by shielding the top and bottom light emitting parts of the sealing body 54 by means of light shielding members 55a and 55b and to increase the brightness of the emitted light from the curved light emitting part 53.

The aforementioned light emitting diode 21, 41 or 51 is formed by die-bonding or wire-bonding the light emitting element 23 on the element substrate 22, 42 or 52 provided with circuit patterns or electrodes and thereafter by attaching a die (not shown) for forming the sealing body 24, 44 or 54 formed on the element substrate 22, 42 or 52, for example, the circuit substrate 26 and by filling a translucent epoxy resin into the die.

The light shielding members 25a, 25b, 45a, 45b, 55a and 55b may be provided by disposing a separate die after the sealing body is formed and filling non-translucent epoxy resin into the die, or by bonding light shielding members (not shown) which are separately formed to the previously formed sealing body with an adhesive.

In addition, in the above embodiments, although the transparent epoxy resin is used as the material making the sealing body, it is possible to obtain a high light-scattering effect by mixing fine particles having a high reflectance such as silicon dioxide ($SiO_2$) or titanium oxide ($TiO_2$) into the transparent epoxy resin.

It is, also, possible to form a color-light emitting back light unit by mixing one or more colorants of some colors in the resin material.

As described above, according to the light emitting diode of the present invention, the versatility is very high, because the light emitting direction can be set to spread in two dimensional space or flatland.

Especially, because the present invention provides the light emitting diode giving a spread of light in the flatland, when the light emitting diode is used for a back light unit having a light receiving surface which spreads in the flatland, it is possible to illuminate uniformly the back light unit with a high brightness.

What is claimed is:

1. A light emitting diode, comprising:
an element substrate;
a light emitting element mounted on the element substrate at rear surface thereof;
a translucent sealing body for sealing the light emitting element and having a plurality of light emitting surfaces capable of emitting light from the light emitting element in X, Y and Z axial directions; and
light shielding members attached only to top and bottom light emitting surfaces and configured to shield light emitted in the up and down Z axial direction from the top and bottom light emitting surfaces;
wherein light from the rear surface in the X axial direction is shielded by the element substrate,
wherein light from the light emitting element is emitted from the front light emitting surface and side light emitting surfaces to spread out in the X and Y axial directions.

2. The light emitting diode according to claim 1, wherein the sealing body has a trapezoidal shape in which the side light emitting surfaces incline inwardly toward the front light emitting surface so that light emitted from the side light emitting surfaces has forward directivity.

3. A back light unit, comprising:
a mount substrate;
the light emitting diode as recited in claim 1 and mounted on a surface of the mount substrate; and
an optical wave-guide having a light receiving surface to face the front light emitting surface of the light emitting diode,
wherein at least one light emitting diode is disposed on the mount substrate so that light emitted from the at least one light emitting diode spreads out horizontally from the front light emitting surface and side light emitting surfaces on the sealing body towards the entire light receiving surface of the optical wave-guide.

4. The back light unit according to claim 3,
wherein the front light emitting surface of the sealing body facing the light receiving surface of the optical wave-guide is disposed to be generally in parallel with the light receiving surface of the optical wave-guide,
wherein the side light remitting surfaces of the sealing body are formed to incline toward inwardly toward the front light emitting surface.

5. The back light unit according to claim 3,
wherein at least two light emitting diodes are mounted on the mount substrate,
wherein the light emitting diodes are disposed at an interval such that light emitted from the side light emitting surfaces of each of the light emitting diodes is disposed to be overlap as the light enters the light receiving surface of the optical wave-guide.

6. The back light unit according to claim 3,
wherein the light emitting diode and the optical wave-guide are mounted on the mount substrate to be at a same level surface.

* * * * *